_(US005905439A)_

United States Patent [19]
McIntyre

[11] Patent Number: 5,905,439
[45] Date of Patent: May 18, 1999

[54] APPARATUS AND METHOD FOR MONITORING A PLURALITY OF PARALLEL LOADS HAVING A COMMON SUPPLY

[75] Inventor: Dennis A. McIntyre, Rochester, N.Y.

[73] Assignee: Eastman Kodak Company, Rochester, N.Y.

[21] Appl. No.: 08/922,153

[22] Filed: Sep. 2, 1997

[51] Int. Cl.$^6$ .................................................. G08B 21/00
[52] U.S. Cl. .......................... 340/664; 340/660; 340/661; 324/522; 324/771; 324/76.11
[58] Field of Search ..................................... 340/664, 660, 340/657, 661, 662, 663; 324/76.11, 771, 537, 522

[56] References Cited

U.S. PATENT DOCUMENTS

| | | |
|---|---|---|
| 3,577,064 | 5/1971 | Nercessian . |
| 3,735,201 | 5/1973 | May . |
| 3,809,985 | 5/1974 | Krause et al. . |
| 3,813,666 | 5/1974 | Gately . |
| 3,846,698 | 11/1974 | Lawton . |
| 4,096,394 | 6/1978 | Ullmann et al. .......................... 307/46 |
| 4,241,336 | 12/1980 | Schonken . |
| 4,255,669 | 3/1981 | Naugle . |
| 4,316,187 | 2/1982 | Spencer . |
| 4,363,061 | 12/1982 | Vaerewyck et al. ....................... 324/96 |
| 5,001,465 | 3/1991 | Siegel . |
| 5,471,134 | 11/1995 | Oudille et al. ........................ 324/103 P |
| 5,502,374 | 3/1996 | Cota ........................................ 324/127 |

*Primary Examiner*—Nina Tong
*Attorney, Agent, or Firm*—Susan L. Parulski

[57] ABSTRACT

Apparatus and method for monitoring parallel loads on a common supply. An intermittent AC current is supplied to a plurality of load devices disposed in parallel on the common supply. A current sensor senses the current supplied to the load devices and provides a corresponding signal to a comparator. The comparator compares the sensed current with two values: a threshold load level of current corresponding to the operation of the plurality of load devices, and a threshold current level. An error signal is generated by a controller if the sensed current level is less than the threshold current level and if the sensed current is less than the threshold load level.

3 Claims, 10 Drawing Sheets

APPARATUS AND METHOD FOR MONITORING A PLURALITY OF PARALLEL LOADS HAVING A COMMON SUPPLY

FIELD OF THE INVENTION

The present invention relates to a monitoring apparatus and method. More particularly, it relates to an apparatus and method for monitoring parallel load devices on a common supply.

BACKGROUND OF THE INVENTION

In a manufacturing application, a plurality of load devices may be disposed in parallel on a common supply. If one of the devices is not functioning properly, the manufacturing application may be affected. Accordingly, it is desirable to monitor the load devices for their functionality and provide a signal indicative of an abnormal operation condition.

U.S. Pat. No. 5,001,465 relates to a plurality of continuously operating proximity sensors mounted upon a crane boom which detect a dangerous condition. Filtering removes noise and harmonics from an output signal, which if greater than a desired voltage, triggers an alarm.

U.S. Pat. No. 4,316,187 is directed to an apparatus for verifying the load rating of an active alternating current distribution circuit. Averaging and rectification of the alternating current are conducted.

While these references may have achieved a certain degree of success in their particular application, the systems apply averaging and long time delays to the sensing process. This is unsuitable for intermittent duty applications, particularly when an instantaneous loss of one or more of the load devices is difficult to detect when only a single AC cycle of current is applied using a single sensing conductor.

Accordingly, there exists a need for a monitoring apparatus and method directed to intermittent duty applications wherein a fast, continuous response is provided without use of averaging or other data collection techniques.

SUMMARY OF THE INVENTION

An object of the invention is to provide a monitoring apparatus and method for a plurality of load devices on a common supply.

Another object of the invention is to provide such an apparatus and method which is directed to intermittent duty applications.

Yet another object of the invention is to provide such an apparatus and method which does not use averaging or other data collection techniques so that the waveform can be examined.

These objects are given only by way of illustrative example. Thus, other desirable objectives and advantages inherently achieved by the disclosed invention may occur or become apparent to those skilled in the art. The invention is defined by the appended claims.

According to one aspect of the invention, there is provided a method for monitoring parallel loads on a common supply. The method includes applying an intermittent AC current to a plurality of load devices disposed in parallel on the common supply; defining a predetermined threshold load level of current; reading a waveform cycle of the AC current applied to the plurality of load devices; detecting the presence or absence of current from the reading and generating a current signal representative thereof; determining a flowing level of current from the reading; comparing the flowing level with the threshold load level; and indicating an abnormal condition if the current signal is indicative of the presence of the current and the flowing level is less than the threshold load level.

According to another aspect of the invention, there is provided a method for monitoring parallel loads on a common supply. The method includes applying an intermittent AC current to a plurality of load devices disposed in parallel on the common supply, and defining a predetermined threshold load level of current corresponding to the operation of the plurality of load devices. From reading a waveform cycle of the AC current applied to the plurality of load devices and generating a load signal representative thereof, the presence or absence of current can be detected and a representative current signal can be generated. An error signal is provided if the current signal is indicative of the presence of the current and the load signal is less than the threshold load level.

According to a further aspect of the invention, there is provided a monitoring apparatus. The apparatus includes a plurality of load devices disposed on a single supply of AC current. A controller is provided to direct an intermittent supply of AC current to the plurality of load devices. A current sensor senses the current supplied by the controller. A comparator, having a threshold load input and a threshold current input, compares the sensed current with the load input and current input. An error generator provides an error signal when the sensed current is less than the threshold current input and the sensed current is less than the threshold load input.

The present invention provides a monitoring apparatus and method directed to intermittent duty applications wherein a loss of one or more parallel loads can be sensed without use of averaging or other data collection techniques. The present invention provides a fast, continuous response, and can be applied to common power frequencies and voltage levels.

BRIEF DESCRIPTION OF THE DRAWINGS

The foregoing and other objects, features, and advantages of the invention will be apparent from the following more particular description of the preferred embodiments of the invention, as illustrated in the accompanying drawings.

DETAILED DESCRIPTION OF THE INVENTION

Figure 1:
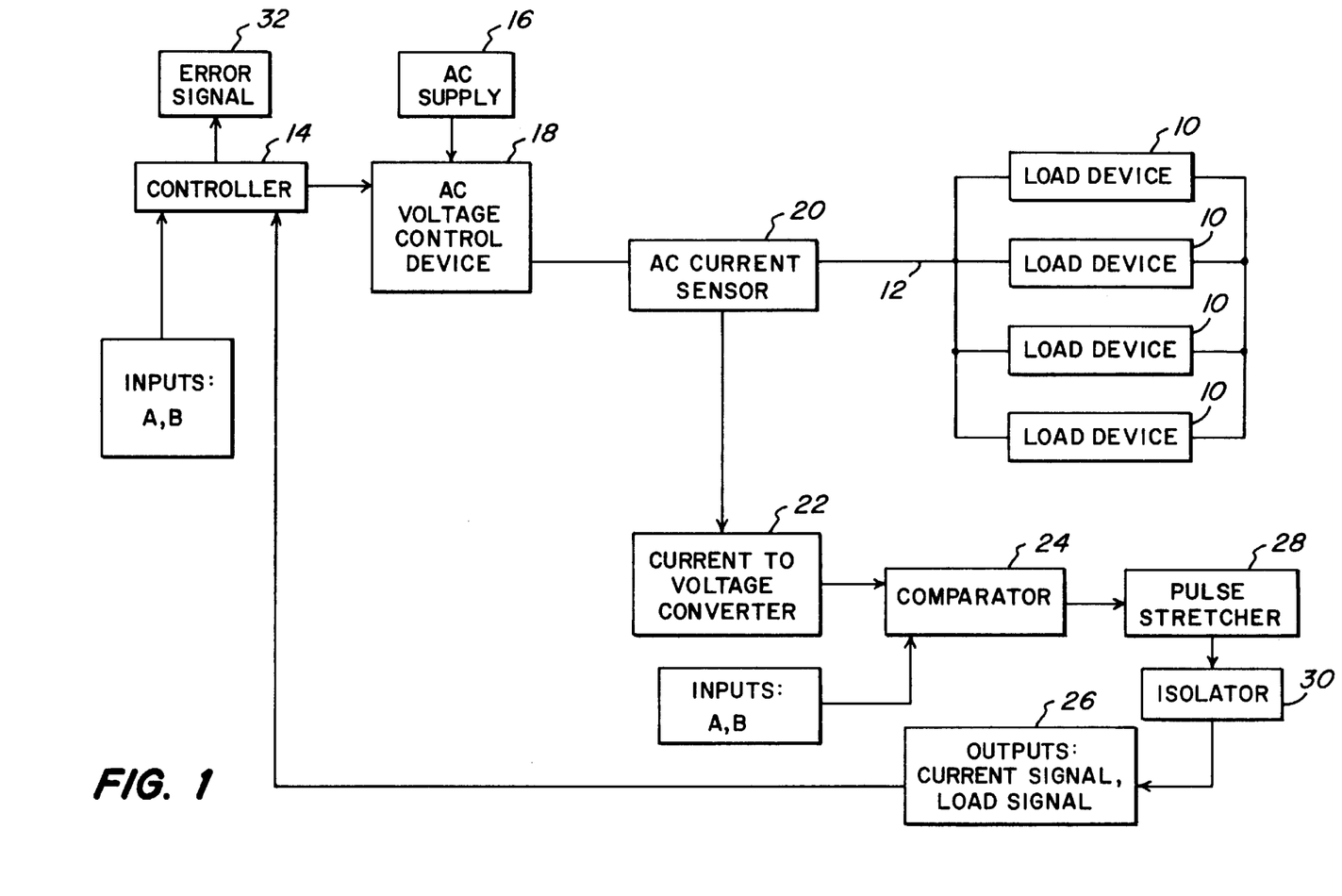
FIG. 1 generally illustrates a block diagram of an apparatus in accordance with the present invention.

Referring to FIG. 1, a plurality of load devices 10 are disposed in parallel on a common supply 12, whereby the voltage across each load device is substantially equal. Load devices 10 may be such devices as heaters, lights, or fans. The load devices disposed in parallel may be of the same type or varied.

A controller 14 controls an intermittent supply of AC current 16 by means of an AC voltage control device 18, such as a solid state relay. Controller 14 can be a Programmable Logic Controller (PLC), a computer, or other control apparatus. An AC current sensor 20 disposed on supply 12 senses the level of current applied by controller 14 to load devices 10.

A first current threshold level A is set by an operator to define a minimum current level which is to be sensed by current sensor 20. This threshold level A indicates whether current is being applied to load devices 10. Thus, when the intermittent current is applied, threshold level A is reached. Conversely, when current is not applied, threshold level A is not reached since there is no current applied to common supply 12.

A second current threshold level B is set by an operator to define a level of current which is utilized by all load devices 10 when all load devices 10 are active. If any one of the load devices is not active, threshold level B is not reached. Conversely, if all load devices 10 are active, threshold level B is reached.

Figure 2:
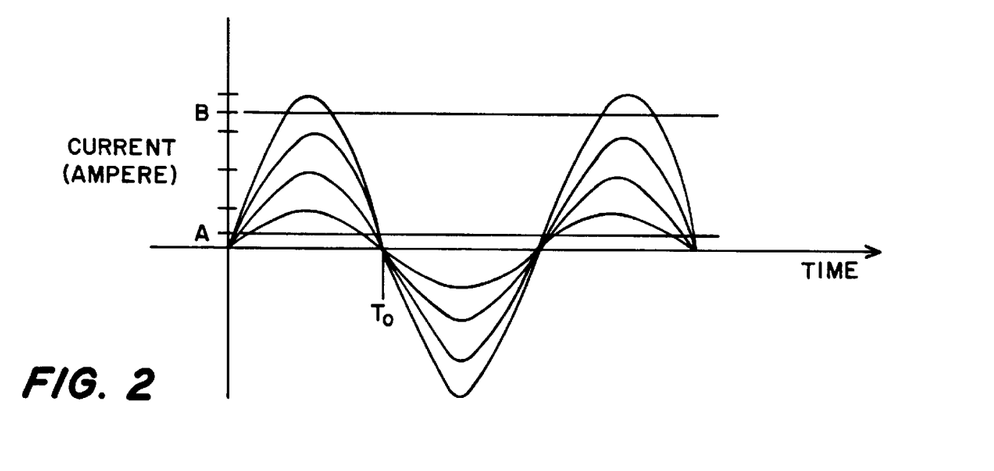
FIG. 2 shows a graph of time versus AC current for four load devices.
Figure 3:
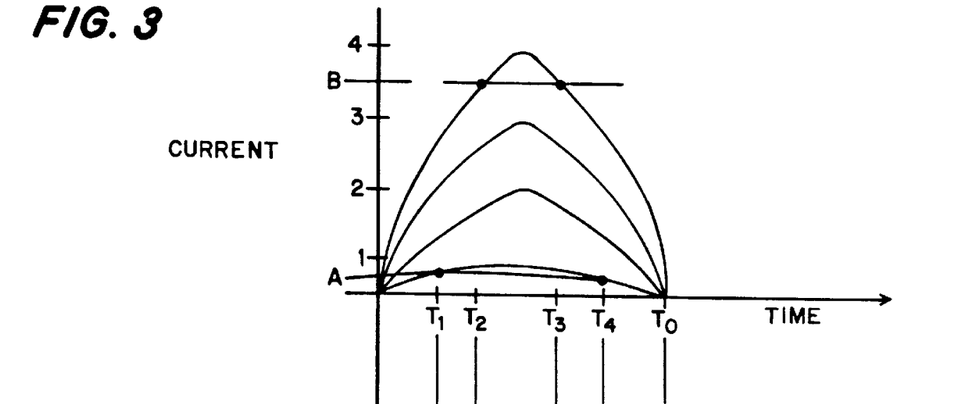
FIG. 3 shows a portion of the graph shown in FIG. 2.

The values of threshold levels A and B are determined by an operator for a particular configuration. For example, for the apparatus illustrated in FIG. 1, four load devices 10 are disposed in parallel. FIG. 2 shows a graph of time versus AC current for one to four such load devices which each draw 1 ampere of current during operation, while FIG. 3 shows a portion of FIG. 2 from time 0 to $T_0$. Threshold level A could be set at 0.5 ampere, whereby the sensing of at least one-half ampere by current sensor 20 would indicate that current is provided to load devices 10. Similarly, if threshold level B is set at 3.5 ampere, if current sensor 20 senses at least 3.5 amperes, then all load devices are in operation. If current sensor 20 senses less than threshold level B (i.e., 3.5), then at least one load device 10 is not operational.

Figure 4:
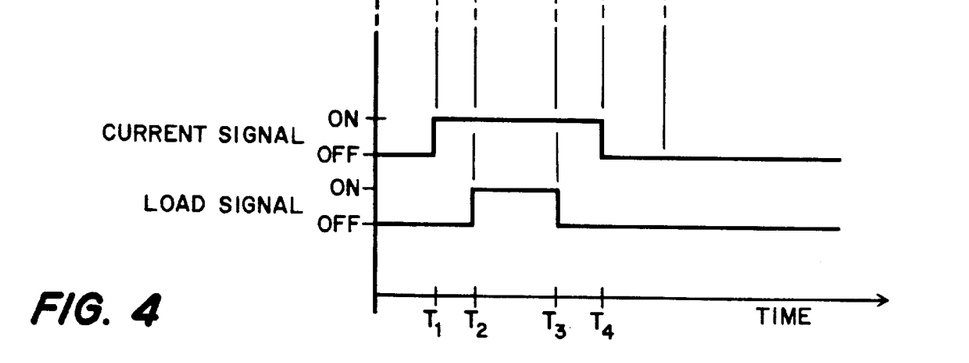
FIG. 4 shows a current and load signal corresponding to FIG. 3.

A comparator 24 compares the sensed current level with threshold levels A and B. (An optional current-to-voltage converter 22 can be used to convert the AC current sine wave of the applied current sensed by current sensor 20 to a voltage sinewave whose amplitude is directly proportional to the sensed current.) Referring to FIG. 4, which corresponds with FIG. 3, if the sensed current level is greater than threshold level A, a Current Signal is defined as ON (time $T_1$ to $T_4$). Conversely, if the sensed current level is less than threshold level A, the Current Signal is defined as OFF. Similarly, if the sensed current is greater than threshold level B, a Load Signal is defined as ON (time $T_2$ to $T_3$), and if the sensed signal is less than threshold level B, Load Signal is defined as OFF.

Figure 5:
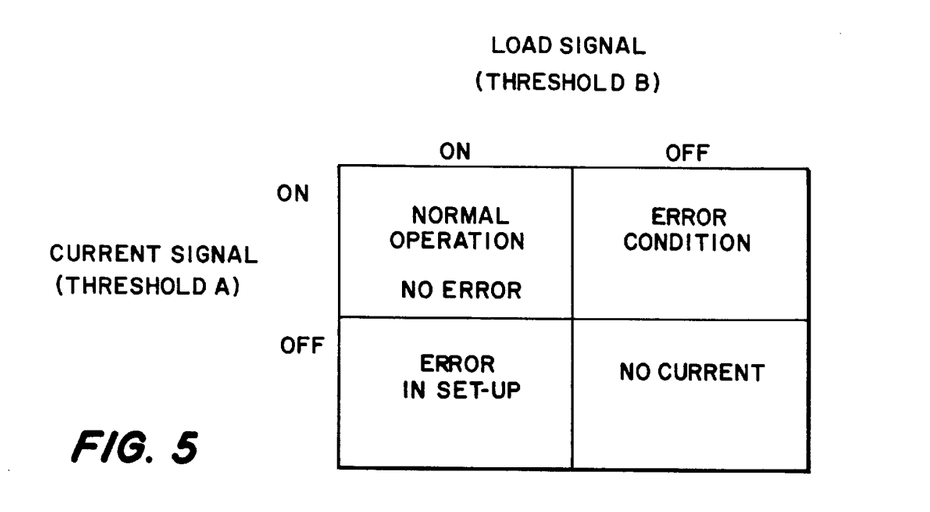
FIG. 5 shows a chart illustrating a correspondence between the current signal and load signal.

As can be seen from the chart in FIG. 5, normal operation occurs when both the Current Signal and Load Signal are ON. An error condition occurs when the Current Signal is ON and the Load Signal is OFF since, although the current is applied, one or more of the load devices is not operating normally. If the Current Signal is OFF and the Load Signal is OFF, there is an error in the set-up. If the Current Signal is OFF and the Load Signal is OFF, then no current is being pulsed. The last condition may occur if there is an open wire. For example, since controller 14 establishes when the load devices are activated, controller 14 can provide a "no load" sensed condition when the current is not sensed. For example, controller 14 signals AC voltage control device 18 to pulse AC supply 16, thereby expecting an ON state for the Current Signal. If, instead, an OFF state is received for the Current Signal, and the Load Signal is OFF, then a "no load" sensed condition can be provided.

The Current Signal and Load Signal are provided as outputs 26 which are fed back to controller 14. If an error condition exists, as referenced in FIG. 5, an error signal 32 is produced.

Figure 6A:
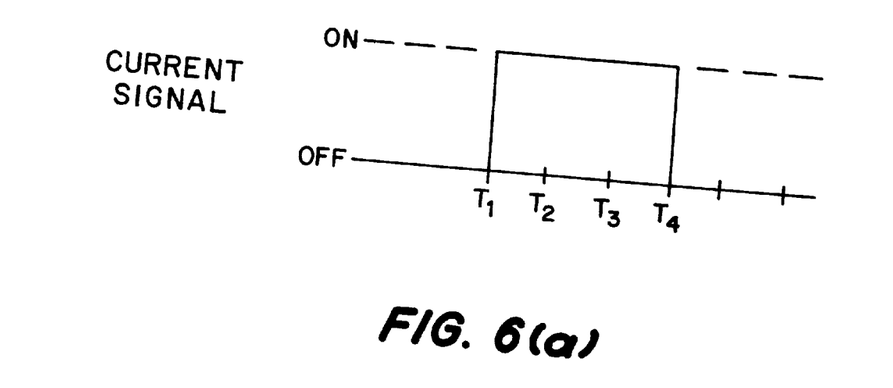
FIGS. 6(a) and 6(b) show a current signal before and after, respectively, processing by a pulse stretcher.
Figure 6B:
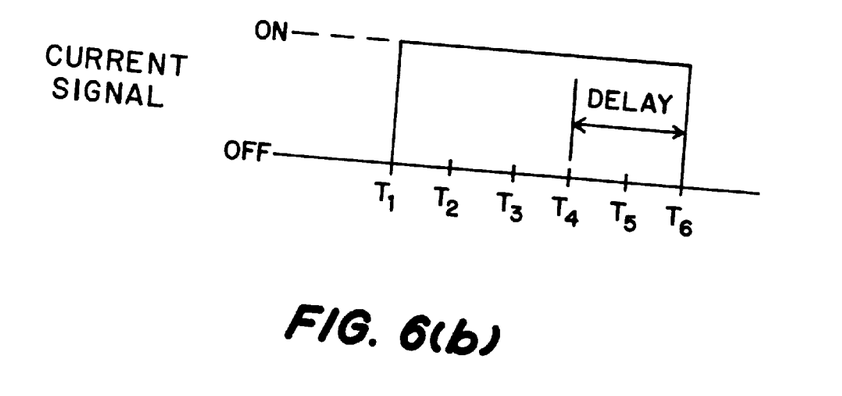

Prior to being fed back to controller 14, the Current Signal and Load Signal may be stretched in time by pulse stretcher 28 to provide time to process the signals. That is, pulse stretcher 28 maintains the signal's ON state for a predetermined time period, after which the state would be OFF. For example, if the Current Signal is ON from time $T_1$ to $T_4$ (FIG. 6(a)), pulse stretcher 28 would stretch the signal to remain ON until a time $T_6$, thereby allowing controller 14 time to process the signal within its control scan time. As shown in FIG. 6(b), the pulse is delayed by a time $T_4$ to $T_6$. The time duration between the sensing of the current by current sensor 20 (i.e., the stretching in time) is dependent on the configuration. A 100 millisecond delay has been found suitable. The signals are further isolated from the controller 14 by an isolator 30 so that the signals do not interfere with the other components.

As is noted by the apparatus, no averaging and long time delays are present which would make detecting an instantaneous loss of one or more load devices difficult with only a single AC current cycle. The apparatus of the present invention allows an operator to determine, within one or more AC duty cycles, that all of the load devices are responding properly. A loss of one or more load devices prevents the Load Signal from being in the ON state.

EXAMPLE

An example is now provided. While the particular example is directed to an intermittent operation of the AC current, the apparatus and method can be applied to continuous duty operations wherein current is continuously being drawn.

Figure 7:
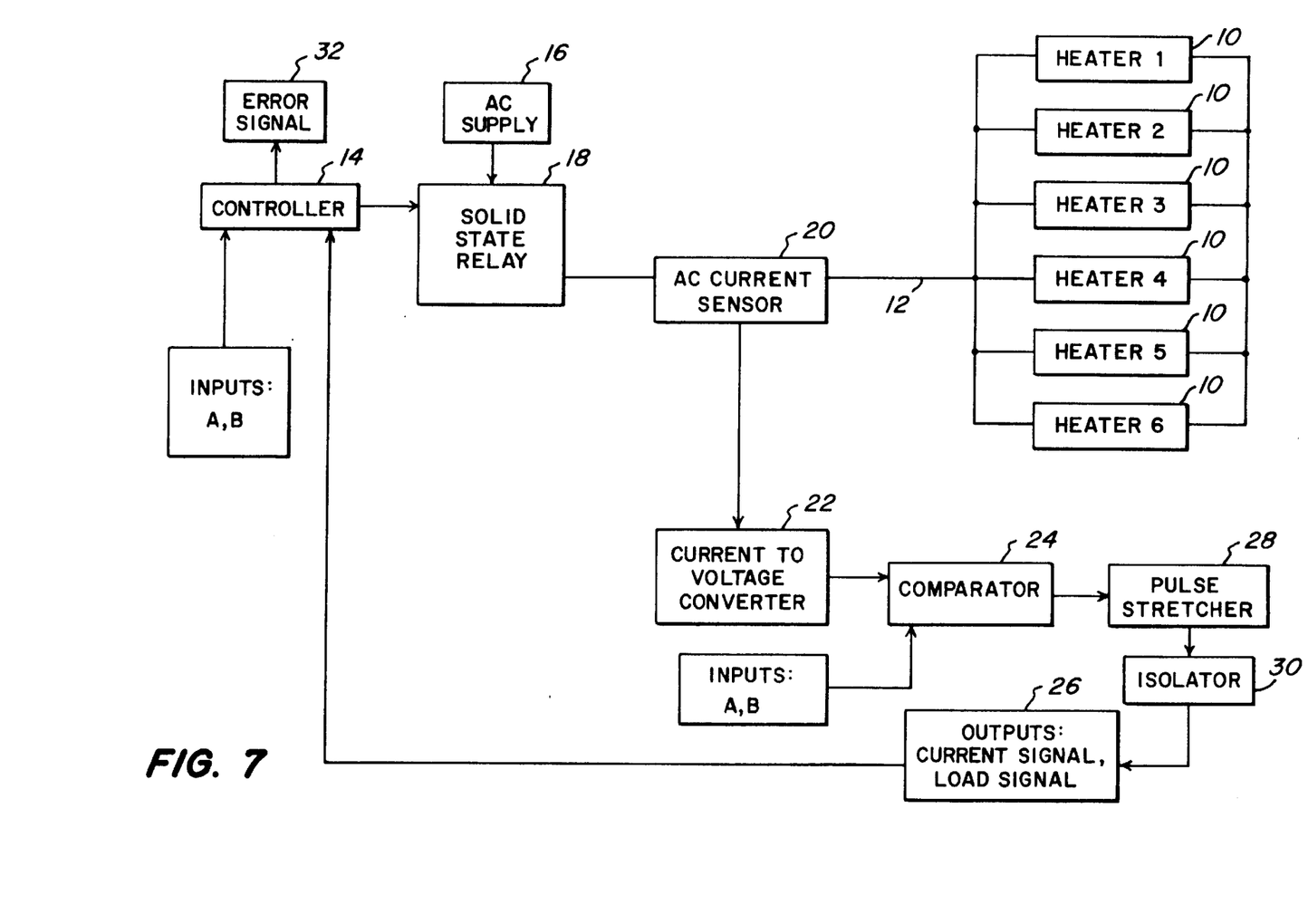
FIG. 7 shows a block diagram of an example of an apparatus in accordance with the present invention.

Referring to FIG. 7, load devices 10 are six heaters disposed in parallel on common supply 12. The heaters are intended to maintain a desired level of heat per duty cycle. To maintain this desired level, the heaters are pulsed by the application of intermittent current by a solid state relay 18. The pulsing time may vary depending on the amount of heat required by the heaters. For ease of discussion, each heater 10 draws 1 ampere of current, with the six heaters drawing a total of 6 amperes if all where operational.

Figure 8:
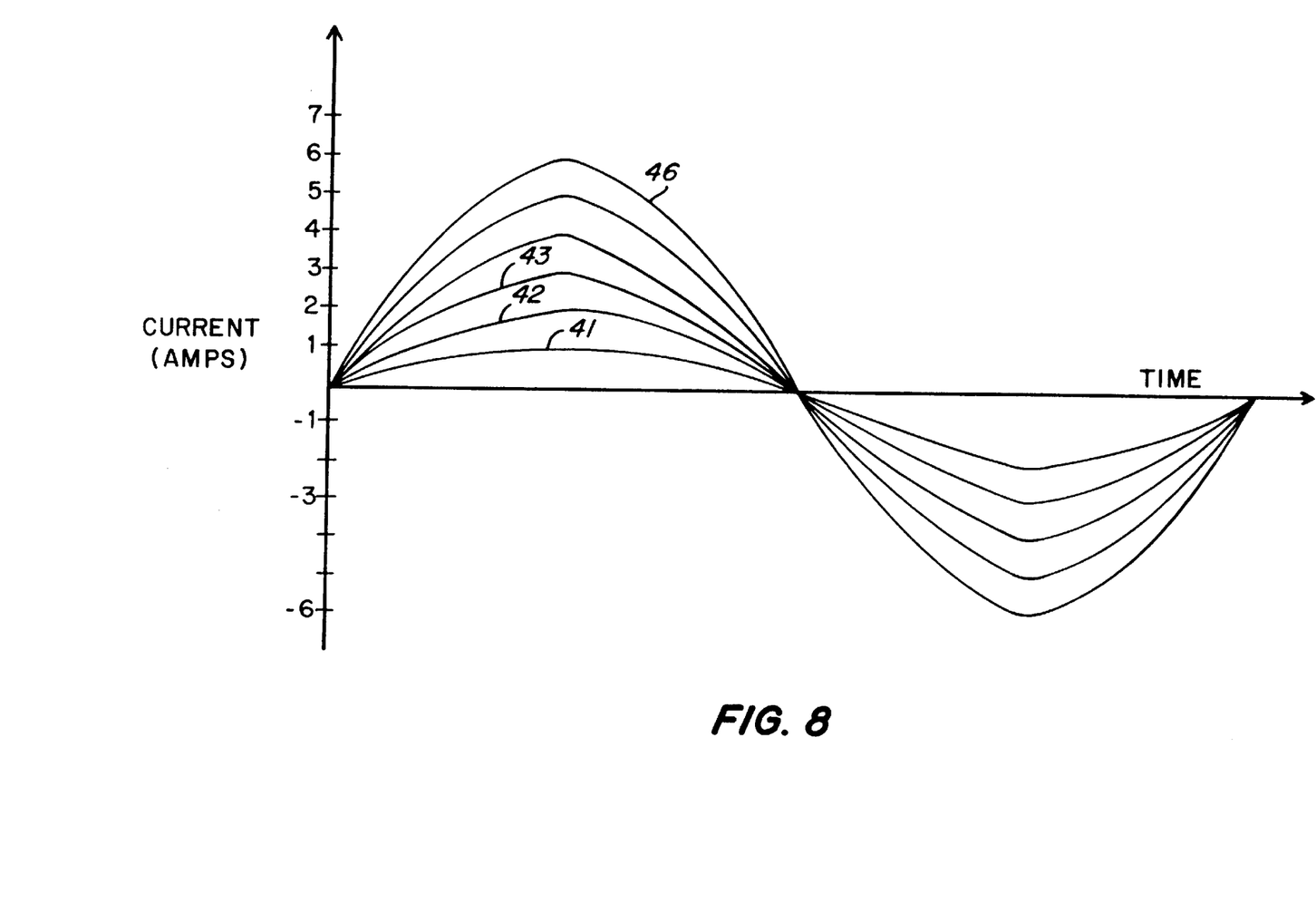
FIG. 8 shows one current waveform duty cycle corresponding to the load devices of the example shown in FIG. 6.

FIG. 8 illustrates a current waveform seen by the comparator depicting the current level which would be sensed by current sensor 20 for each heater operating. As shown, one operating heater would draw a first level 41 of current; two heaters would draw a second level 42 of current; three heaters would draw a third 43 level of current. Six operational heaters would draw the most current at 6 amperes, noted as level 46.

Figure 9A:
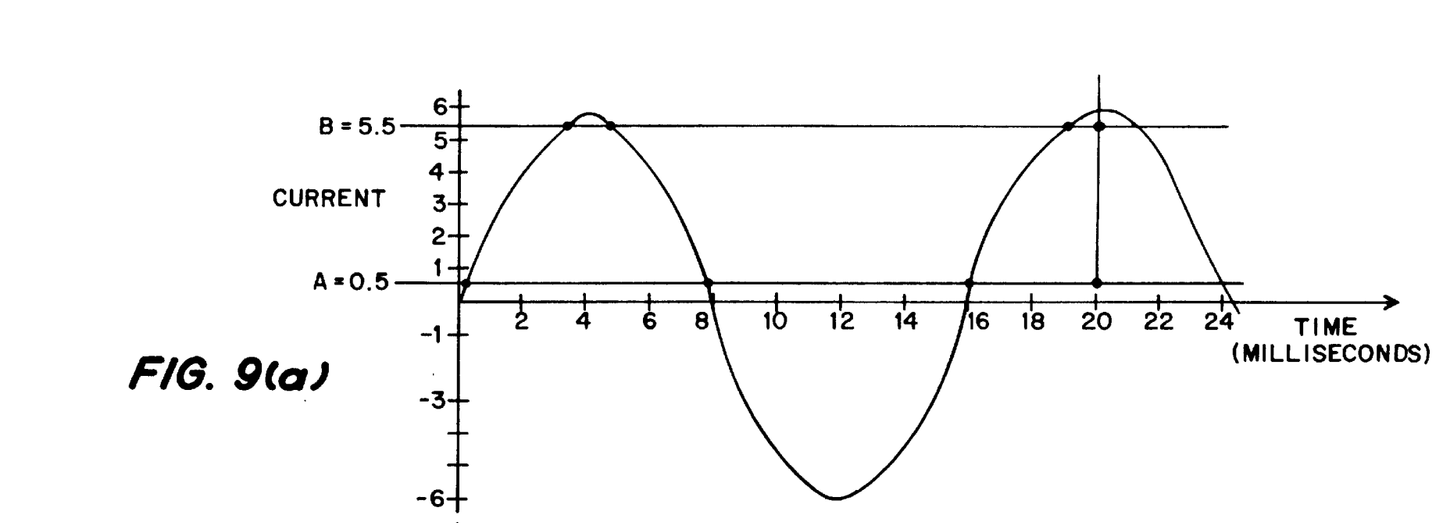
FIGS. 9(a)–9(e) show a condition for the example shown in FIG. 6 wherein no error signal is generated.
Figure 9B:
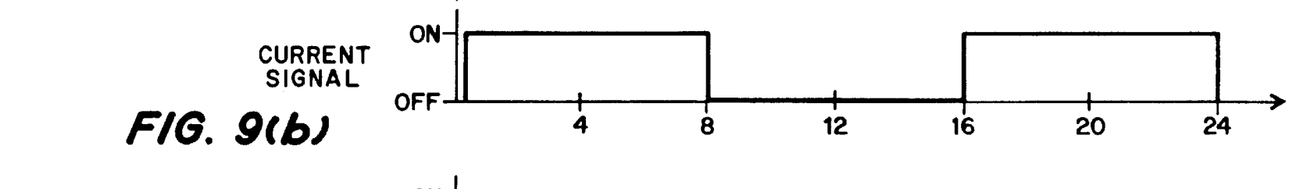
Figure 9C:
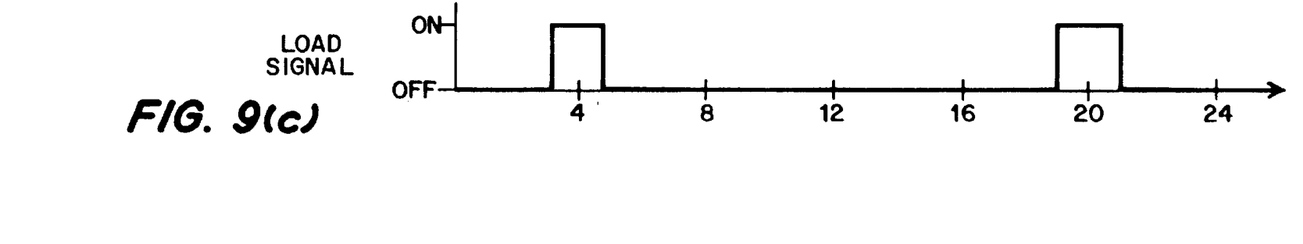
Figure 9D:
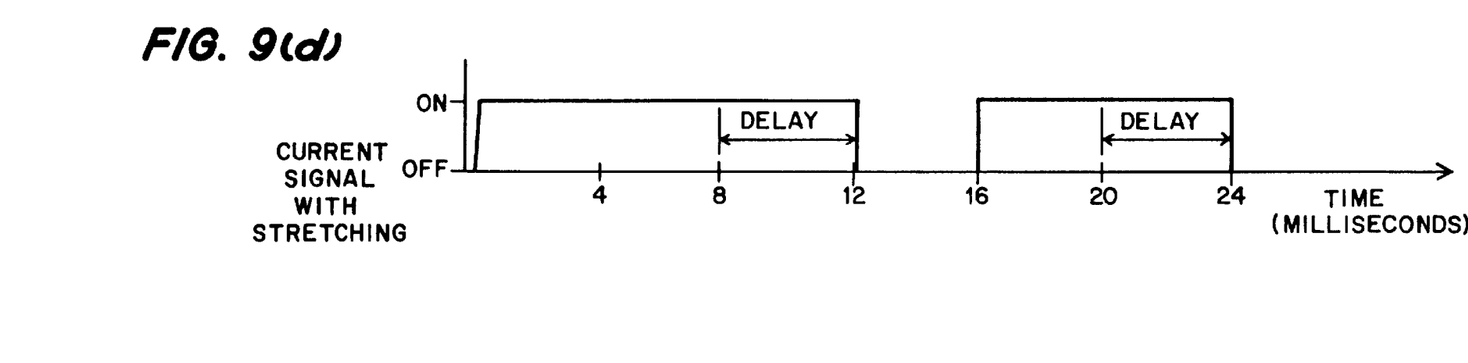
Figure 9E:
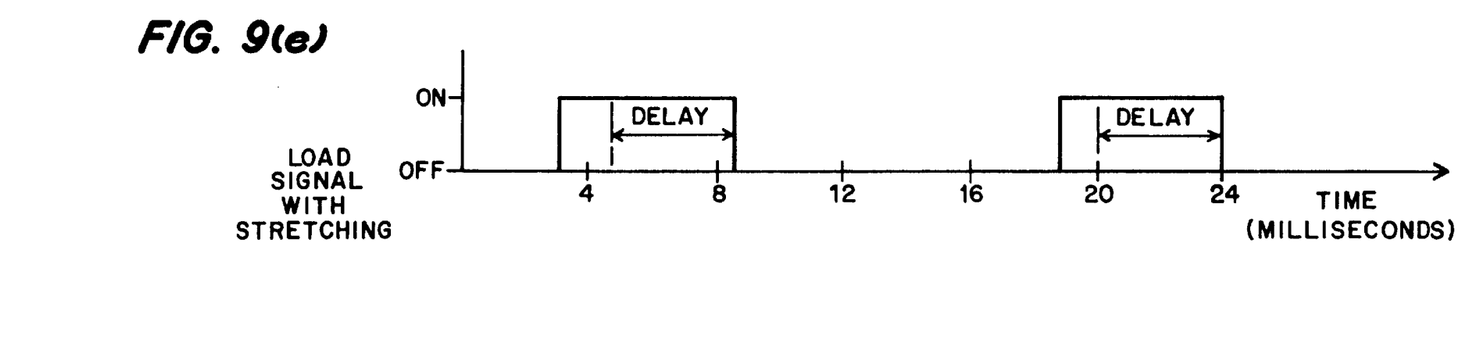
Figure 10A:
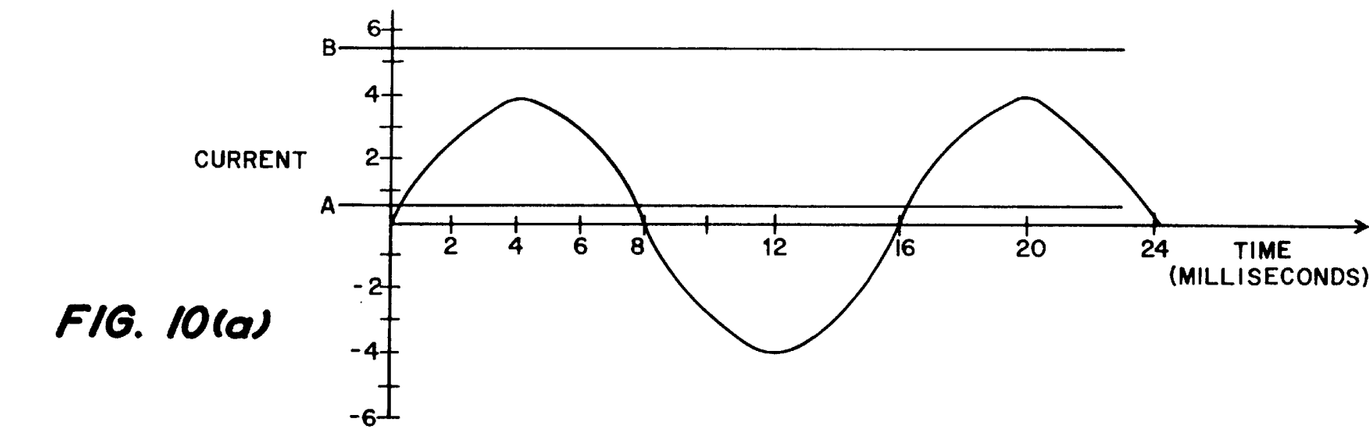
FIGS. 10(a)–10(e) show a condition for the example shown in FIG. 6 wherein an error signal is generated.
Figure 10B:
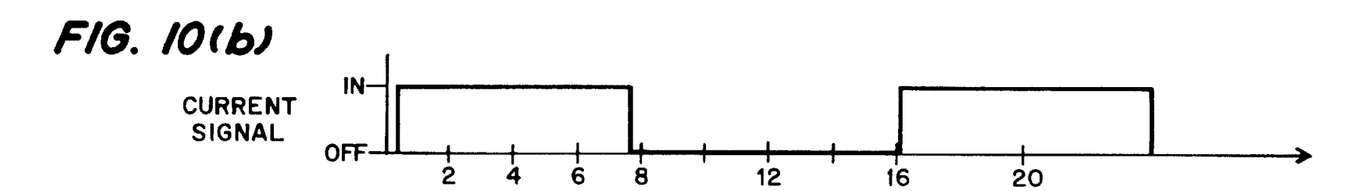
Figure 10C:
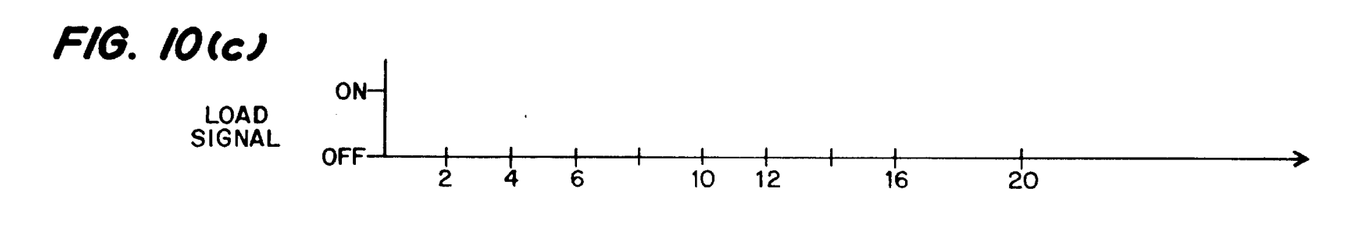
Figure 10D:
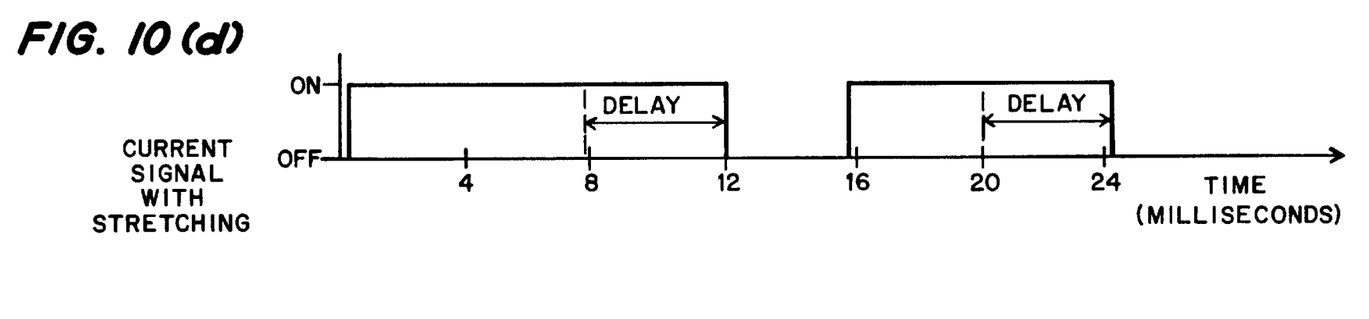
Figure 10E:
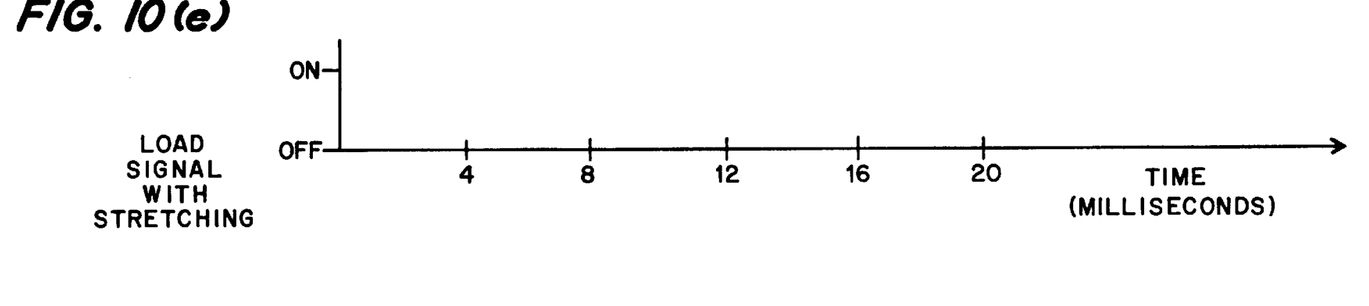

Threshold level A is defined as a minimum current level which is sensed. Referring to FIG. 9(a), threshold level A is selected to be about 0.5 amperes so that if at least one heater is operational, at least 0.5 amperes are flowing. Thus, when solid state relay 18 pulses the current, threshold level A is reached (i.e., ON). Conversely, if current is not applied, threshold level A is not reached (i.e., OFF).

Threshold level B is defined as the level of current which is utilized by all the heaters when all the heaters are active. Therefore, as shown in FIG. 9(a), threshold level B is selected to be 5.5 since 6.0 amperes would be generated if all six heaters were operational. If threshold level B is not reached, Load Signal is OFF, indicating that at least one of the heaters is not active. An error condition then exists if threshold level B is OFF (i.e., not reached) and threshold level A is ON (i.e., reached).

For ease of discussion, a sinewave is one duty cycle. A minimum pulse time is determined by the frequency of the incoming current. For the instant example using 60 Hz, the duty cycle is approximately 16 milliseconds. This minimum ensures that at least one positive half cycle of AC current is passed to the heaters.

Controller 14 directs solid state relay 18 to provide a pulse of AC current for a predetermined time period, for example, 24 milliseconds. The current is sensed by current sensor 20 and compared by to threshold levels A and B.

FIGS. 9(*a*)–9(*c*) illustrates a first situation wherein all six heaters are operational while FIGS. 10(*a*)–10(*c*) illustrate a second situation wherein one heater is not operational.

Referring to FIG. 9(*a*), the current is pulsed on for 24 milliseconds. The peak amplitude of the current is about 6 amperes, which activates the Load Signal to an ON state (FIG. 9(*c*)) at the same time that the Current Signal is an ON state (FIG. 9(*b*)). Therefore, no error signal is generated.

If pulse stretcher 28 is employed, the stretched Current Signal and stretched Load Signal are as shown in FIGS. 9(*d*) and 9(*e*), respectively. For illustrative purposes, the signals have been stretched by approximately 4 milliseconds. This is marked in the figures as the "delay", and provides controller 14 with additional time to process the signals.

Retriggering may occur if a stretched signal overlaps with a current pulse. For example, the stretched Current Signal is valid for a transition from ON to OFF. If the Current Signal changes from OFF to ON before the duration of the stretch time (i.e., the "delay"), then the Current Signal is reset for the next pulse.

Referring to FIG. 10(*a*), the current is pulsed for 24 milliseconds. The peak amplitude of the current is about 4 amperes, which is less than threshold level B. Consequently, as shown in FIG. 10(*b*), the Load Signal is not activated and retains an OFF state during the entire 24 milliseconds. Threshold level A is reached, therefore, the Current Signal is activated to an ON state as shown in FIG. 10(*c*). Since Load Signal is OFF and Current Signal is ON, error signal 32 is generated by controller 14.

If pulse stretcher 28 is employed, the stretched Current Signal and stretched Load Signal are as shown in FIGS. 10(*d*) and 10(*e*), respectively. The Current Signal is marked with a "delay" of approximately 4 milliseconds. However, the Load Signal retains an OFF state, therefore, there is no signal to stretch. Since the Load Signal is OFF and the Current Signal is ON, error signal 32 is generated by controller 14.

The invention has been described in detail with particular reference to certain preferred embodiments thereof, but it will be understood that variations and modifications can be effected within the spirit and scope of the invention.

What is claimed is:

1. A method for monitoring parallel loads on a common supply, comprising:

applying an intermittent AC current to a plurality of load devices disposed in parallel on the common supply;

defining a predetermined threshold load level of current;

reading a waveform cycle of the AC current applied to the plurality of load devices;

detecting the presence or absence of current from the reading and generating a current signal representative thereof;

determining a flowing level of current from the reading;

comparing the flowing level with the threshold load level; and indicating an abnormal condition if the current signal is indicative of the presence of the current and the flowing level is less than the threshold load level.

2. A method for monitoring parallel loads on a common supply, comprising:

applying an intermittent AC current to a plurality of load devices disposed in parallel on the common supply;

defining a predetermined threshold load level of current corresponding to the operation of the plurality of load devices;

reading a waveform cycle of the AC current applied to the plurality of load devices and generating a load signal representative thereof;

detecting the presence or absence of current from the reading and generating a current signal representative thereof; and providing an error signal if the current signal is indicative of the presence of the current and the load signal is less than the threshold load level.

3. A monitoring apparatus, comprising:

a plurality of load devices disposed on a single supply of AC current;

a controller directing an intermittent supply of AC current to the plurality of load devices;

a current sensor sensing the current supplied by the controller;

a comparator having a threshold load input and a threshold current input, the comparator comparing the sensed current with the load input and current input; and an error generator providing an error signal when the sensed current is less than the threshold current input and the sensed current is less than the threshold load input.

* * * * *